(12) United States Patent
Vinje et al.

(10) Patent No.: US 10,547,321 B2
(45) Date of Patent: Jan. 28, 2020

(54) METHOD AND APPARATUS FOR ENABLING WIDE INPUT COMMON-MODE RANGE IN SAR ADCS WITH NO ADDITIONAL ACTIVE CIRCUITRY

(71) Applicant: Microchip Technology Incorporated, Chandler, AZ (US)

(72) Inventors: Anders Vinje, Trondheim (NO); Ivar Løkken, Trondheim (NO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/166,733

(22) Filed: Oct. 22, 2018

(65) Prior Publication Data

US 2019/0123758 A1   Apr. 25, 2019

Related U.S. Application Data

(60) Provisional application No. 62/576,350, filed on Oct. 24, 2017.

(51) Int. Cl.
  *H03M 1/46*   (2006.01)
  *H03M 1/18*   (2006.01)
  *H03M 1/12*   (2006.01)

(52) U.S. Cl.
  CPC ......... *H03M 1/466* (2013.01); *H03M 1/1245* (2013.01); *H03M 1/18* (2013.01)

(58) Field of Classification Search
  CPC ...... H03M 1/466; H03M 1/18; H03M 1/1245; H03M 1/468
  USPC ........................................ 341/155, 163, 172
  See application file for complete search history.

(56) References Cited

U.S. PATENT DOCUMENTS 7,965,218 B2 *   6/2011   Ohnhaeuser ............ H03M 1/08
                                                     341/161
8,717,221 B2 *   5/2014   Jeon .................... H03M 1/0678
                                                     341/172

OTHER PUBLICATIONS

Chen, Yanfei et al., "A 9-bit 100-MS/s 1.46-mW Tri-Level SAR ADC in 65 nm CMOS," IEICE Transactions on Fundamentals of Electronics, Communications and Computer Sciences, Engineering Sciences Society, vol. 393A, No. 12, pp. 2600-2608, Dec. 1, 2010.
(Continued)

*Primary Examiner* — Khai M Nguyen
(74) *Attorney, Agent, or Firm* — Slayden Grubert Beard PLLC

(57) ABSTRACT

A differential successive approximation register (SAR) analog-to-digital converter (ADC) with wide input common-mode range adds one step to its conversion process. No additional circuitry is required for full rail-to-rail common mode voltage operation. In a first step the top-plate nodes vcp and vcn may be reset to a fixed voltage vcm. Then in a next step sampling may be performed while leaving vcp and vcn floating but shorted. Whereby a single node vx is formed, which provides for simple capacitive voltage division. Thereafter a standard sequential SAR bit-by-bit analog-to-digital conversion is performed. the voltage at node vx will follow vcmin during the entire sampling phase, with a limitation in rate of change only limited by the RC time constant of the shorting switch and the sampling capacitors. This will have much higher bandwidth than any active OTA-based tracking circuit.

16 Claims, 9 Drawing Sheets

(56) References Cited

OTHER PUBLICATIONS

International Search Report and Written Opinion, Application No. PCT/US2018/057212, 23 pages, dated Jan. 25, 2019.
Zhu, Yan et al., "A 10-bit 100-MS/s Reference-Free SAR ADC in 90 nm CMOS," IEEE Journal of Solid State Circuits, vol. 45, No. 6, pp. 1111-1121, Jun. 22, 2010.

* cited by examiner

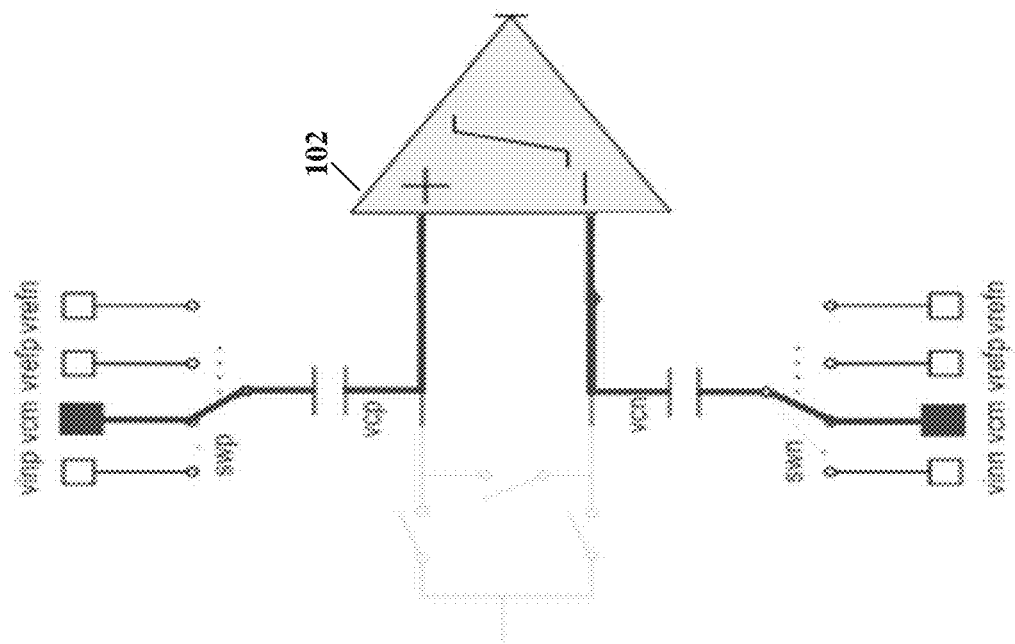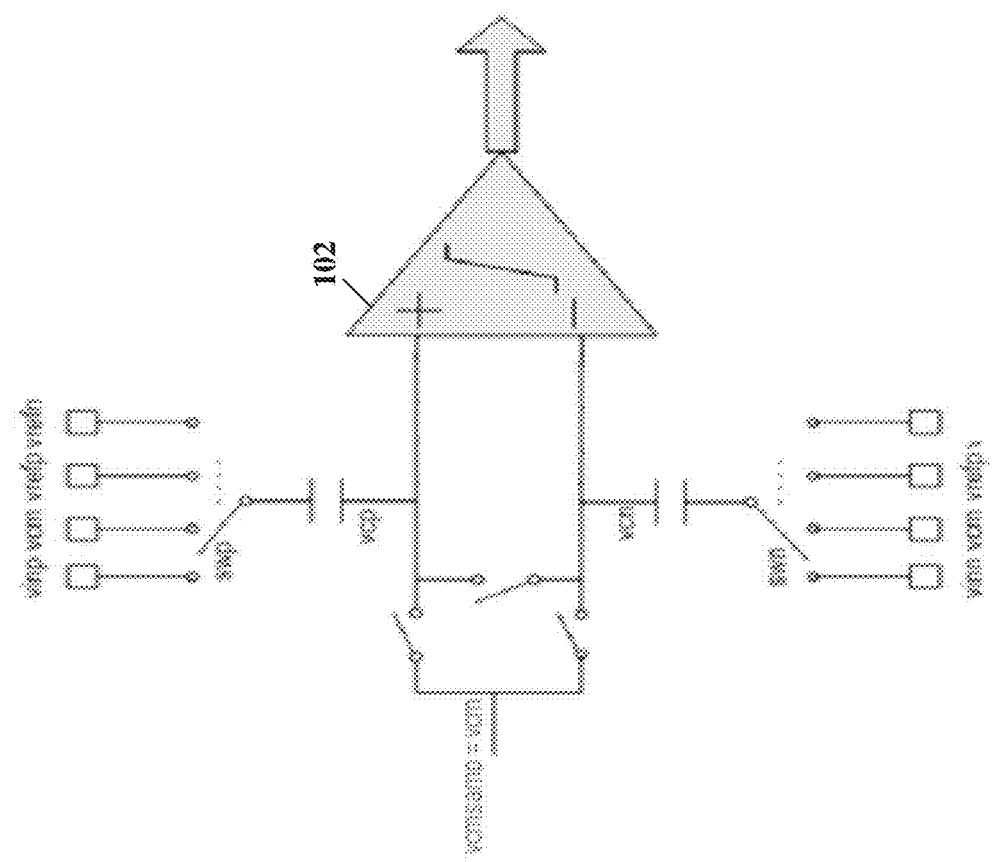
Figure 1

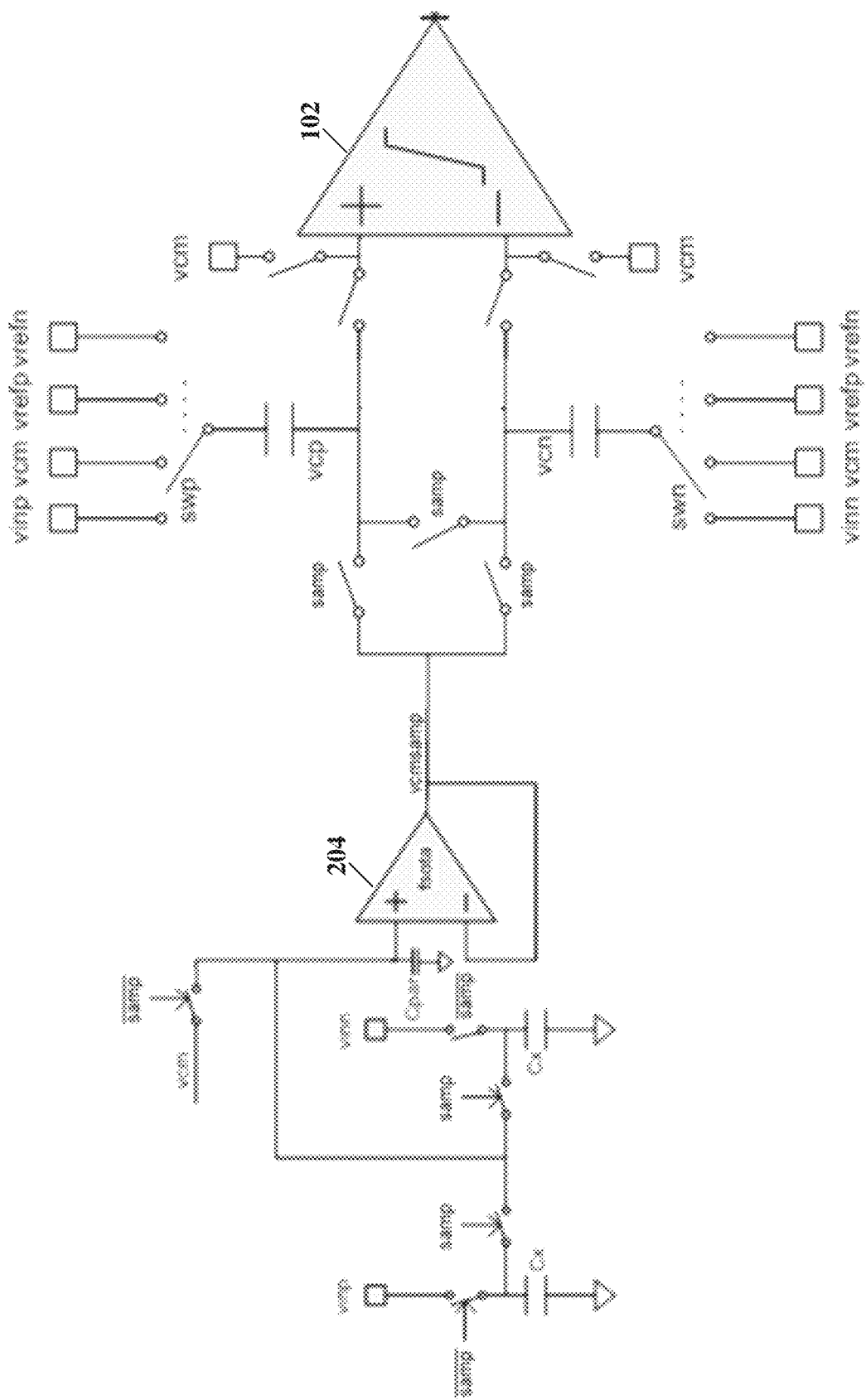
Figure 2 (Prior Technology)

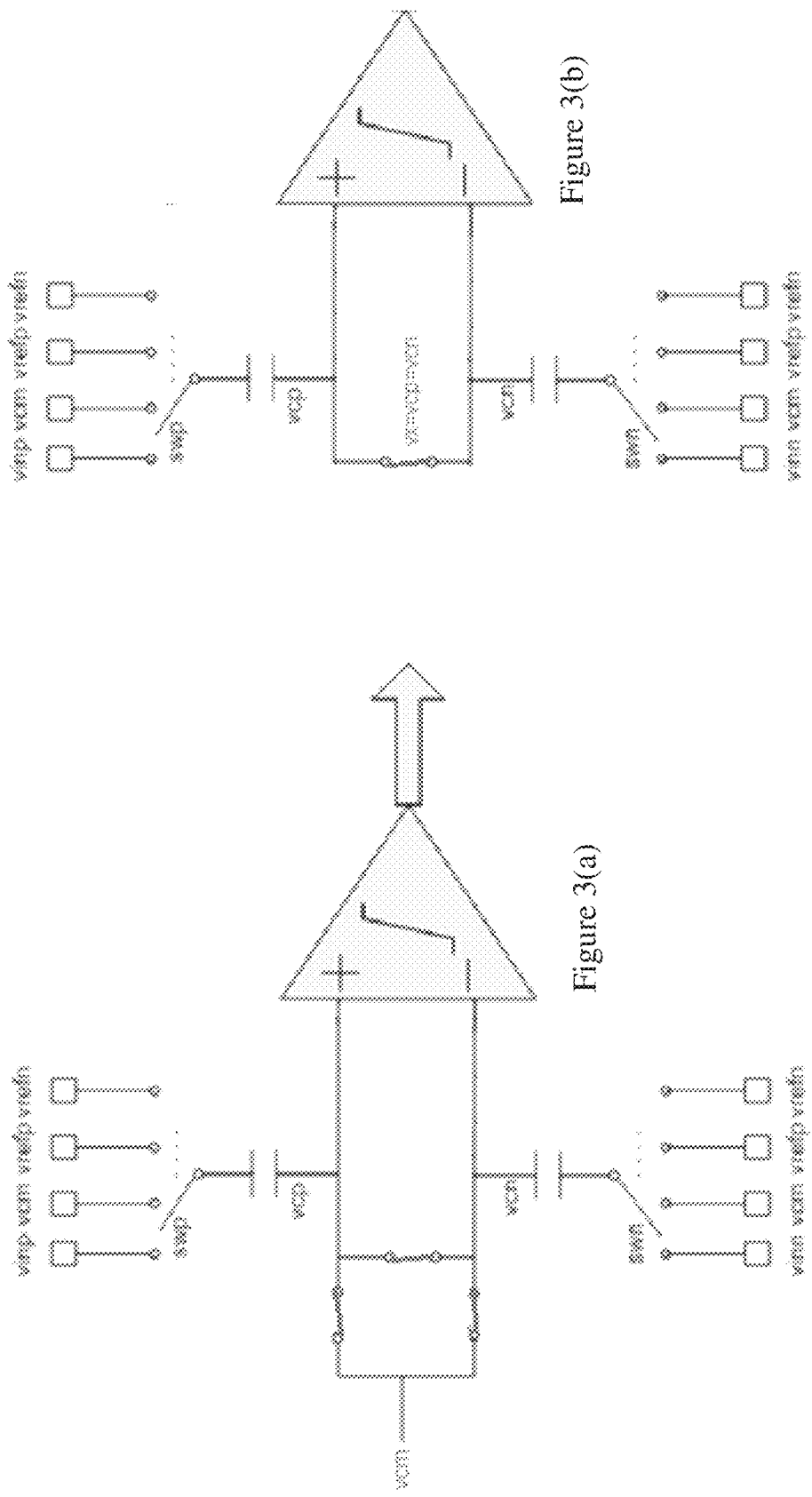

Figure 8 (Prior Technology)

METHOD AND APPARATUS FOR ENABLING WIDE INPUT COMMON-MODE RANGE IN SAR ADCS WITH NO ADDITIONAL ACTIVE CIRCUITRY

RELATED PATENT APPLICATION

This application claims priority to commonly owned U.S. Provisional Patent Application Ser. No. 62/576,350; filed Oct. 24, 2017; entitled "Method for Enabling Wide Input Common-Mode Range in SAR ADCs with No Additional Active Circuitry," by Anders Vinje and Ivar Løkken; and is hereby incorporated by reference herein for all purposes.

TECHNICAL FIELD

The present disclosure relates to analog-to-digital converters (ADC) and, more particularly, to enabling wide input common-mode range in successive approximation register (SAR) ADCs with no additional active circuitry.

BACKGROUND

A successive approximation register (SAR) analog-to-digital converter (ADC) is a type of analog-to-digital converter that converts a continuous analog waveform into discrete digital representations by performing a binary search to converge to the closest quantization level of each sample taken of the analog waveform then providing a digital representations thereof.

SAR ADCs are among the most popular ADC architectures, and may be used in, for example, microcontrollers. A typical differential SAR ADC, including most on the market, have limited input common-mode range which can lead to reduced performance or failure if the input common-mode exceeds the SAR DAC's allowable range. This makes differential SAR ADCs less suited for applications where the input common-mode voltage cannot be controlled, like certain sensor applications, zero-crossing detection and more. This may be circumvented by using additional active circuitry, as shown in FIG. 2, to sample the input common-mode voltage and subtract it during conversion as so as to cancel out its effects. This however is costly in terms of current consumption and integrated circuit die area, and also puts limitations on the input common-mode rate of change allowed.

SUMMARY

Therefore, what is needed is a differential SAR ADC that has better common-mode voltage rejection and amplitude handling capabilities while requiring minimal or no additional circuitry.

According to an embodiment, a method for providing wide input common-mode range in a successive approximation register (SAR) analog-to-digital convertor (ADC) may comprise the steps of: resetting top plate nodes vcp and vcn of a plurality of binary weighted capacitors to a voltage vcm; sampling differential voltages Vinp and Vinn on bottom plate nodes vcp and vcn, respectively, while coupling the top plate nodes vcp and vcn together and floating; and performing a sequential SAR analog-to-digital conversion on the sampled differential voltages Vinp and Vinn.

According to a further embodiment of the method, the SAR ADC may be a differential input SAR ADC. According to a further embodiment of the method, the SAR ADC may be fabricated in integrated circuit device. According to a further embodiment of the method, the integrated circuit device may be a microcontroller.

According to another embodiment, a method for providing wide input common-mode range in a successive approximation register (SAR) analog-to-digital convertor (ADC), may comprise the steps of: coupling top plates of a first half of a plurality of binary weighted capacitors to a first input of a voltage comparator and coupling top plates of a second half of the plurality of binary weighted capacitors to a second input of the voltage comparator; coupling a top plate of a first dummy capacitor to the first input of the voltage comparator and coupling a top plate of a second dummy capacitor to the second input of the voltage comparator; coupling a previous first reference voltage to bottom plates of the first half of the plurality of binary weighted capacitors; coupling a previous second reference voltage to bottom plates of the second half of the plurality of binary weighted capacitors; coupling a third reference voltage to the top plates of the plurality of binary weighted capacitors, and to the top and bottom plates of the first and second dummy capacitors; decoupling the bottom plates of the plurality of binary weighted capacitors from the previous first and second reference voltages; coupling the bottom plates of the first half of the plurality of binary weighted capacitors and the bottom plate of the first dummy capacitor to a positive input voltage, Vinp; coupling the bottom plates of the second half of the plurality of binary weighted capacitors and the bottom plate of the second dummy capacitor to a negative input voltage, Vinn; coupling the top plates of the plurality of binary weighted capacitors and the first and second dummy capacitors together; decoupling the top plates of the first half of the plurality of binary weighted capacitors and the first dummy capacitor from the top plates of the second half of the plurality of binary weighted capacitors and the second dummy capacitor; coupling the bottom plates of the plurality of binary weighted capacitors and the first and second dummy capacitors to the third reference voltage; determining whether a first voltage on the first input of the voltage comparator is greater than a second voltage on the second input thereof; wherein if the first voltage is greater than the second voltage then provide a first logic level output from the voltage comparator, and if the first voltage is less than the second voltage then provide a second logic level output from the voltage comparator; and continue doing a successive approximation analog-to-digital conversion until finished with the conversion.

According to a further embodiment of the method, the previous first reference voltage may be from a first digital-to-analog converter (DAC), and the previous second reference voltage may be from a second DAC. According to a further embodiment of the method, the previous first and second reference voltages may be Vref, and the third reference voltage may be Vref/2. According to a further embodiment of the method, the first logic level may be a logic high or logic "1", and the second logic level may be a logic low or logic "0". According to a further embodiment of the method, the SAR ADC may be a differential input SAR ADC. According to a further embodiment of the method, the SAR ADC may be fabricated in integrated circuit device. According to a further embodiment of the method, the integrated circuit device may be a microcontroller.

According to yet another embodiment, a successive approximation register (SAR) analog-to-digital converter (ADC) may be comprise circuitry configured to: couple a third reference voltage to top plates of a plurality of binary weighted capacitors and top and bottom plates of first and second dummy capacitors; couple a previous first reference voltage to bottom plates of a first half of the plurality of binary weighted capacitors; couple a previous second reference voltage to bottom plates of a second half of the plurality of binary weighted capacitors; decouple the bottom plates of the plurality of binary weighted capacitors and the first and second dummy capacitors from the respective first, second and third reference voltages; couple together the bottom plates of the plurality of binary weighted capacitors and the first and second dummy capacitors; couple a positive input voltage, Vinp, to the bottom plates of the first half of the plurality of binary weighted capacitors and the first dummy capacitor; couple a negative input voltage, Vinn, to the bottom plates of the second half of the plurality of binary weighted capacitors and the second dummy capacitor; decouple the bottom plates of the first half of the plurality of binary weighted capacitors and the first dummy capacitor from the bottom plates of the second half of the plurality of binary weighted capacitors and the second dummy capacitor; compare a voltage Vx at the top plates of the first half of the plurality of binary weighted capacitors and the first dummy capacitor with a voltage Vy at the top plates of the second half of the plurality of binary weighted capacitors and the second dummy capacitor; wherein if the voltage Vx is greater than the voltage Vy then couple a fourth voltage to the bottom plate of a most significant bit (MSB) one of the first half of the plurality of binary weighted capacitors, couple a fifth voltage to the bottom plate of a MSB one of the second half of the plurality of binary weighted capacitors, and couple the third voltage to the bottom plates of the remaining plurality of binary weighted capacitors and the first and second dummy capacitors, or if the voltage Vx is less than the voltage Vy then couple the fifth voltage to the bottom plate of the MSB one of the first half of the plurality of binary weighted capacitors, couple the fourth voltage to the bottom plate of the MSB one of the second half of the plurality of binary weighted capacitors, and couple the third voltage to the bottom plates of the remaining plurality of binary weighted capacitors and the first and second dummy capacitors; and continue doing a successive approximation analog-to-digital conversion until finished with the conversion.

According to a further embodiment, the first previous reference voltage may be from a first digital-to-analog converter; the second previous reference voltage may be from a second digital-to-analog converter; the third reference voltage may be Vref/2; the fourth reference voltage may be zero volts; and the fifth reference voltage may be Vref. According to a further embodiment, the successive approximation register (SAR) analog-to-digital converter (ADC) may be a differential input SAR ADC. According to a further embodiment, the SAR ADC may be fabricated in integrated circuit device. According to a further embodiment, the integrated circuit device may be a microcontroller.

BRIEF DESCRIPTION OF THE DRAWINGS

A more complete understanding of the present disclosure may be acquired by referring to the following description taken in conjunction with the accompanying drawings wherein:

FIG. 1 illustrates a simplified schematic diagram of a VCM-based sampling SAR ADC with capacitive DAC, according to the teachings of this disclosure;

FIG. 2 illustrates a schematic diagram of a prior technology solution for enabling rail-to-rail input common mode operation;

Figure 4:
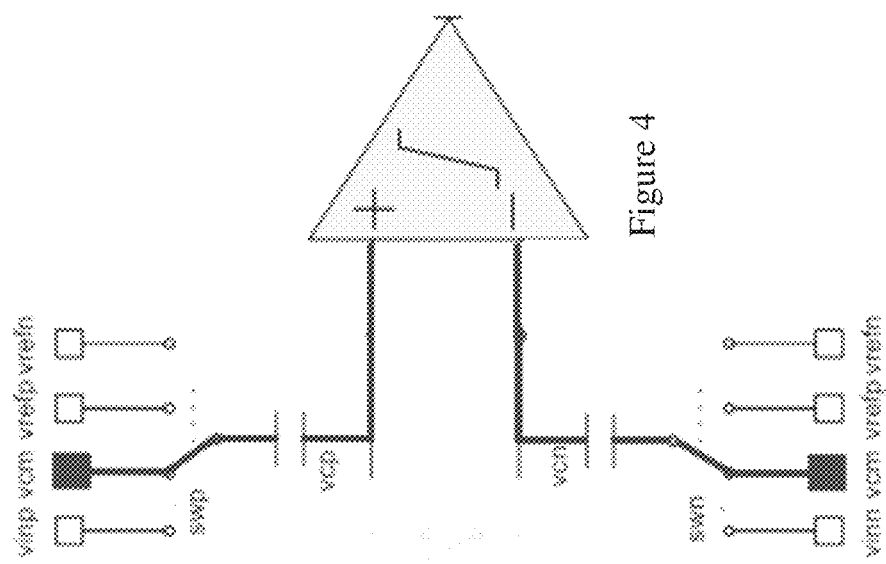
FIG. 4 illustrates schematic diagrams of the transition of sampling to MSB determination phases with passive input common-mode tracking, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Generally, present technology differential SAR ADCs have limited input common-mode range. This makes them less suited for applications where the input common-mode voltage cannot be controlled, like certain sensor applications, zero-crossing detection and the like. Previously published solutions, and earlier solutions developed for various microcontrollers, have relied upon extra circuitry to sample the input common-mode voltage and apply it during conversion so that the common mode voltage is cancelled out. This is, however, costly in terms of current consumption and area, and also puts limitations on the input common-mode rate of change. Embodiments of the present disclosure, in contrast, remove these limitations and require no additional power consuming circuitry or chip area. The only thing required, according to specific example embodiments of this disclosure, is one additional clock cycle per conversion to perform a reset of floating nodes. All required hardware switches are already provided in the SAR DAC circuit; whereby embodiments of the present disclosure achieve rail-to-rail input common-mode range without requiring any circuit modifications or additions.

The SAR DAC circuit disclosed and claimed herein may be easily implemented into an integrated circuit device such as, for example but not limited to, a mixed signal (both analog and digital circuits) microcontroller.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a simplified schematic diagram of a VCM-based sampling SAR ADC with capacitive DAC, according to the teachings of this disclosure. Some SAR ADCs use vcm-based sampling to sample and convert input signals, which is approximately 80% more energy efficient than a conventional SAR algorithm. The signal is sampled and coupled to the input of the comparator 102 as shown in FIG. 1. First the positive and negative inputs are sampled on the bottom plates of a capacitor array, here shown as a single capacitor, with the top-plates shorted to an internally generated common-mode voltage vcmsamp=vcm. Next, in the so-called MSB-phase the bottom plates are connected to the voltage vcm while the top plates are left floating, shifting the nodes vcp and vcn to 2*vcm−vinp and 2*vcm−vinn, respectively. Then the comparator 102 makes the first bit decision (MSB decision) and a binary search algorithm is used to shift binary scaled parts of the capacitor to the reference voltages depending on the comparator output, thereby leading to a successive approximation of the differential input voltage. This approach is similar to top-plate sampling but does not have the same high sensitivity to parasitic capacitance at the comparator input node.

If the comparator common-mode voltage is defined as vcmcomp=(vcp+vcn)/2, then:

$$vcmcomp = \frac{vcp+vcn}{2} = \frac{2 \cdot vcm - vinp + 2 \cdot vcm - vinn}{2} = 2 \cdot vcm - \frac{vinp+vinn}{2} \quad (1)$$

The voltage (vinp+vinn)/2 is equal to the input common-mode voltage, or vcmin, reducing the above equation to:

$$vcmcomp=2 \cdot vcm-vc\min \quad (2)$$

If vcmin=vcm, then the comparator common-mode voltage simplifies to vcmcomp=vcm, which is typically vref/2, but may be chosen at the optimum operating point of the comparator 102. However, if rail-to-rail input common-mode is to be enabled, or vcmin is to be anywhere from 0 to vref, it means vcmcomp can also vary anywhere between 0 to vref. This may lead to a substantial performance reduction of the ADC and a much more complicated comparator design. In some ADCs using this architecture, this can lead to a specified limitation of the allowable range of the input common-mode. Such a limitation is also often seen in datasheets of SAR ADCs from various sources. However, the embodiments of the present disclosure may achieve rail-to-rail input common-mode capability, which gives significant added value to the ADC.

Referring to FIG. 2, depicted is a schematic diagram of a prior technology solution for enabling rail-to-rail input common mode operation. Now during the MSB phase, the nodes vcp and vcn when opened are shifted to (vcm+vcmsamp−vinp) and (vcm+vcmsamp−vinn), respectively, and if vcmsamp=vcmin, equation (1) can be rewritten to:

$$vcmcomp = \frac{vcp+vcn}{2} = vcm + vcmsamp - vcmin = vcm \quad (3)$$

This means that the comparator will maintain its optimum common-mode voltage regardless of the input common-mode voltage. However, the cost is significant, requiring separate sampling capacitors and a switching network to sample the input common-mode voltage, as well as an operational transconductance amplifier (OTA) 204 needing rail-to-rail input and output. In addition, there is an inherent limitation in that vcmsamp is sampled at the start of the sampling phase while vcp and vcn are disconnected at the end of the sampling phase. Thus, any change in vcmin during the sampling phase time will lead to a resulting error in vcmsamp. Some solutions might use an improved continuous-time input common mode tracker to eliminate the latter problem, but still there is significant circuit and area overhead.

Figure 3B:
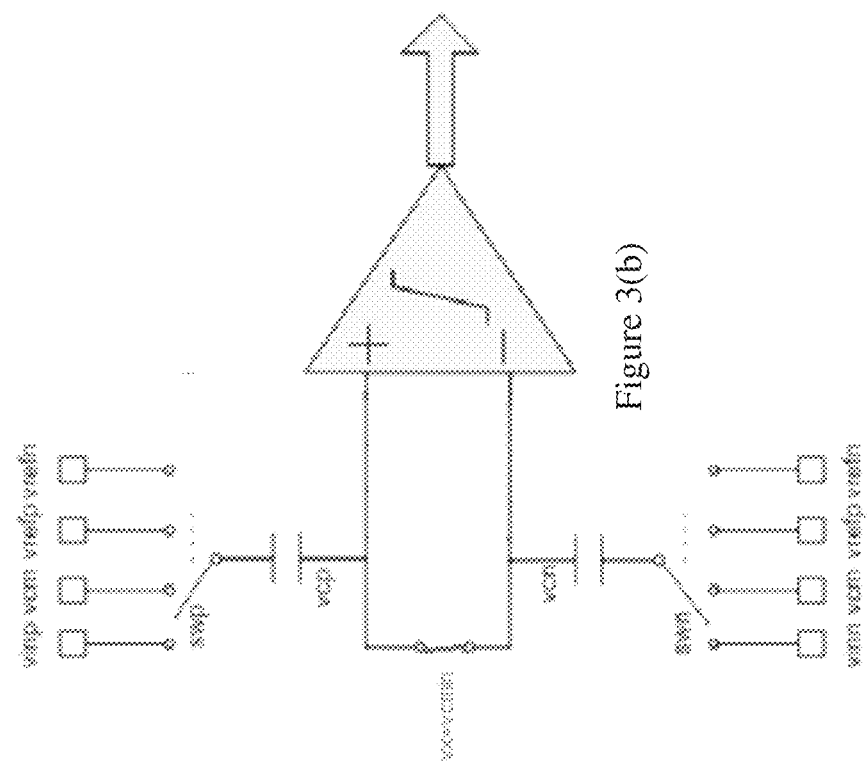
FIG. 3 illustrates schematic diagrams of passive input common-mode tracking in reset and sampling phases, according to specific example embodiments of this disclosure.

Referring to FIG. 3, depicted are schematic diagrams of passive input common-mode tracking in reset and sampling phases, according to specific example embodiments of this disclosure. The circuit shown in FIG. 3 overcome the limitations of common mode range without requiring any separate rail-to-rail circuitry (FIG. 2). This is accomplished by introducing a new cycle (step) to the sampling process. First, the top-plate nodes vcp and vcn may be reset to the fixed voltage vcm, FIG. 3(a). Then, in the second step sampling may be performed while leaving vcp and vcn floating but shorted, FIG. 3(b). Whereby a single node vx is formed, which provides for simple capacitive voltage division:

$$vcp = vcn = vx = vinn + \frac{vinp - vinn}{2} = \frac{vinp + vinn}{2} = vcmin \quad (4)$$

Referring to FIG. 4, depicted are schematic diagrams of the transition of sampling to MSB determination phases with passive input common-mode tracking, according to specific example embodiments of this disclosure. When the MSB phase occurs, the operation performs as shown in FIG. 4, and it follows from it that the relation in equation (3), that vcmcomp=vcm, always holds. Furthermore, the voltage at node vx will follow vcmin during the entire sampling phase, with a limitation in rate of change only limited by the RC time constant of the shorting switch and the sampling capacitors. This will have much higher bandwidth than any active OTA-based tracking circuit (FIG. 2). Also, no additional noise is added by an additional amplifier (204) driving to the top plate nodes. FIG. 4 illustrates going from sampling to MSB phase with passive input common-mode tracking.

Since it is known from the SAR mode of operation that the inputs of the comparator 102, vcp and vcn, will converge towards vcm during the conversion, it means that by the end of a conversion vcp and vcn will both be approximately equal vcm. Thus, when the reset phase shown in FIG. 3(a) is entered, no strong driver is required to settle vx to vcm, since both nodes vcp and vcn already have a voltage which is substantially equal to vcm within one LSB error.

Figure 5:
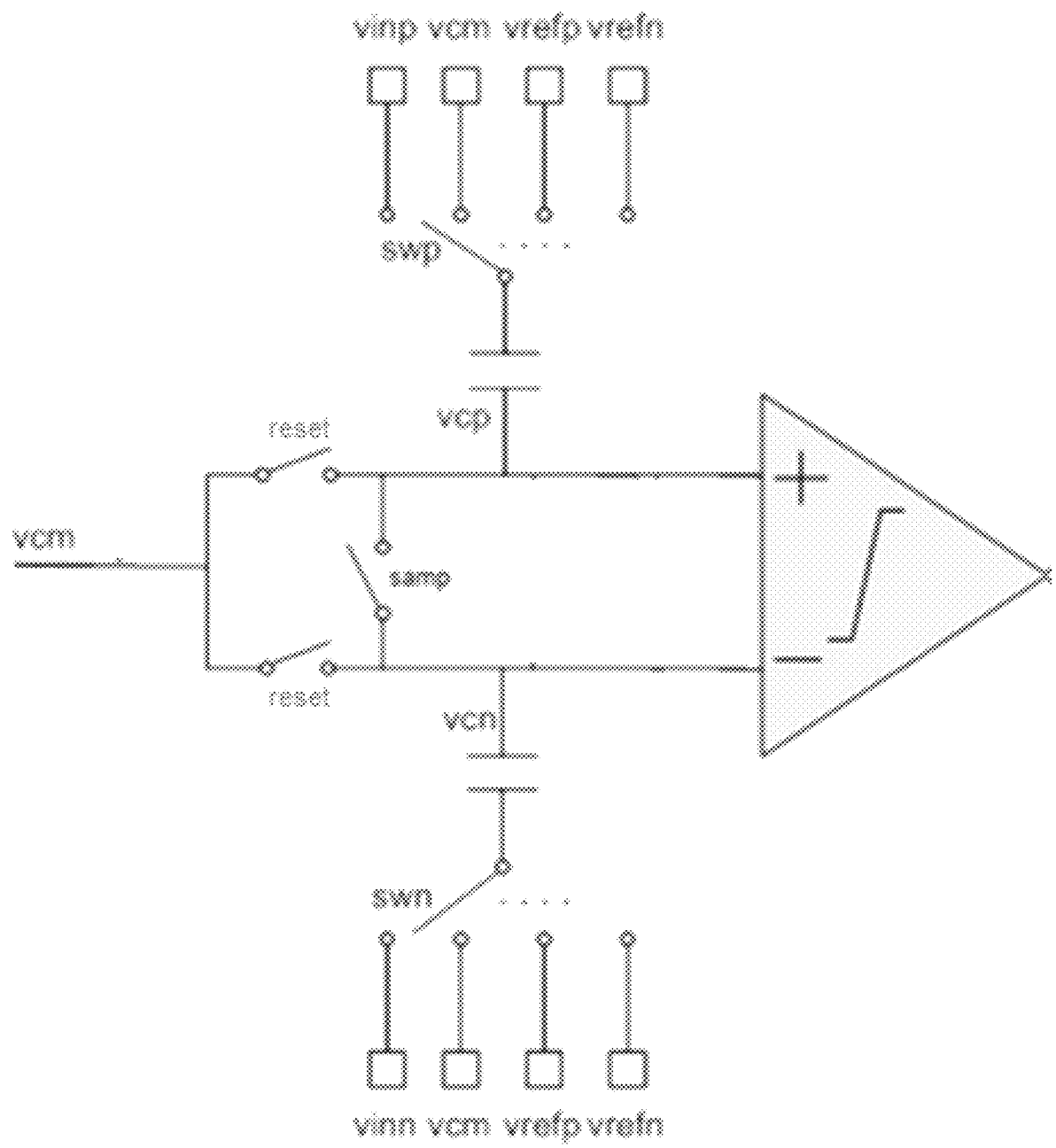
FIG. 5 illustrates a schematic diagram of a passive input common-mode tracking circuit, according to specific example embodiments of this disclosure.

Referring to FIG. 5, depicted is a schematic diagram of a passive input common-mode tracking circuit, according to specific example embodiments of this disclosure. The only additional step needed is the generation of one extra reset signal prior to sampling, which resets the top-plate nodes to vcm before they are left floating. Thus, an analog hardware realization of passive input common-mode tracking may use the circuits shown in FIG. 5.

Figure 6:
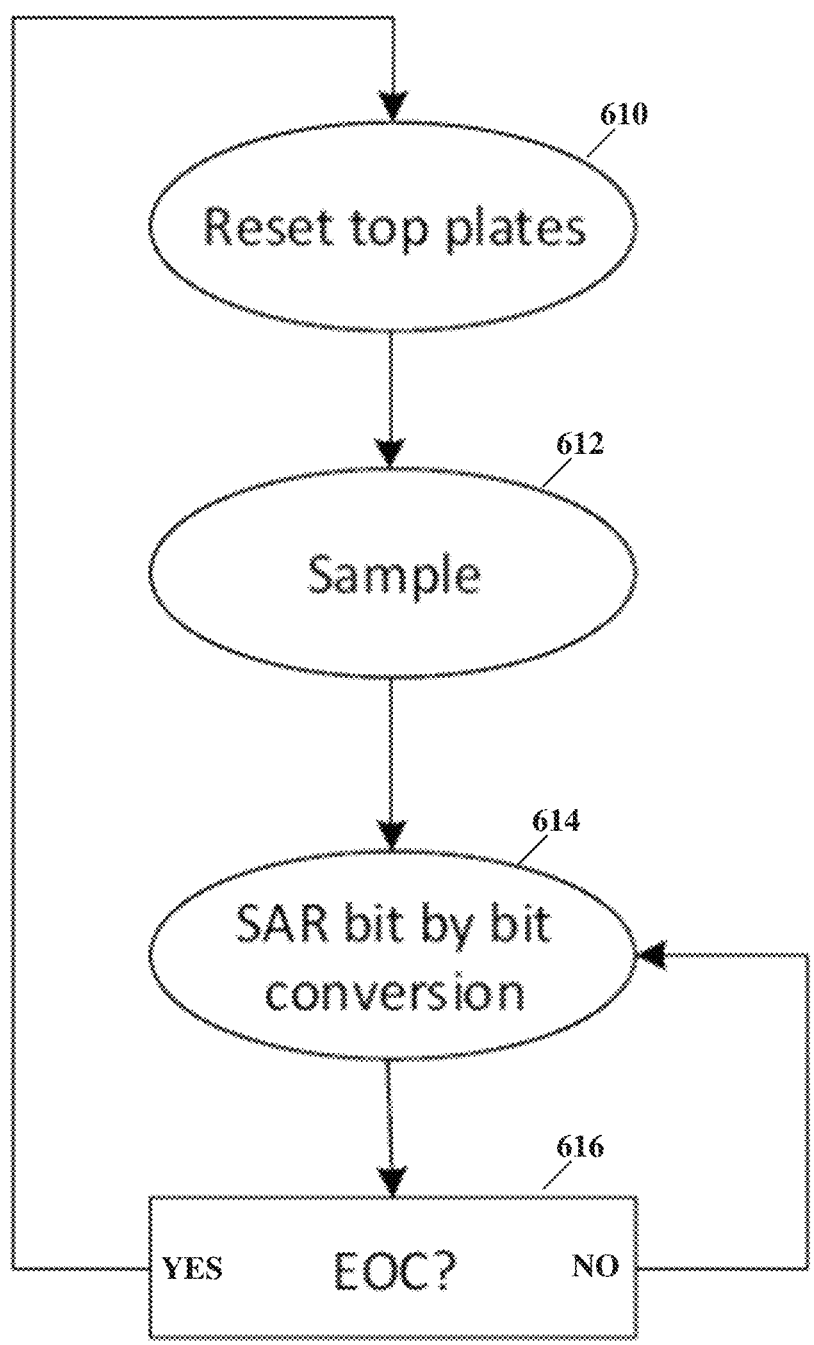
FIG. 6 illustrates a schematic flow diagram of passive input common-mode tracking, according to specific example embodiments of this disclosure.

Referring to FIG. 6, depicted is a schematic flow diagram of passive input common-mode tracking, according to specific example embodiments of this disclosure. In step 610 the top plates are reset to vx. Then a voltage sample is taken in step 612. In step 614 a SAR bit conversion is performed. Step 616 determines whether the SAR bit conversion is finished. If NO, then return to step 614. If YES, then return to step 610. Thus, the digital realization will require only one additional reset phase without requiring any additional hardware, e.g., switches.

Simulations have shown that embodiments of the present disclosure correctly operate even with large scale vcmin changes at many MHz and giving no performance reduction of the ADC. The proposed solution provides continuous-time, rail-to-rail input common-mode capability to the SAR ADC with no additional analog hardware, no practical bandwidth limitations, and only requires one additional clock cycle per conversion to perform the top plate reset. This innovation is applicable to all SAR ADC's using the vcm-based sampling approach.

Figure 7:
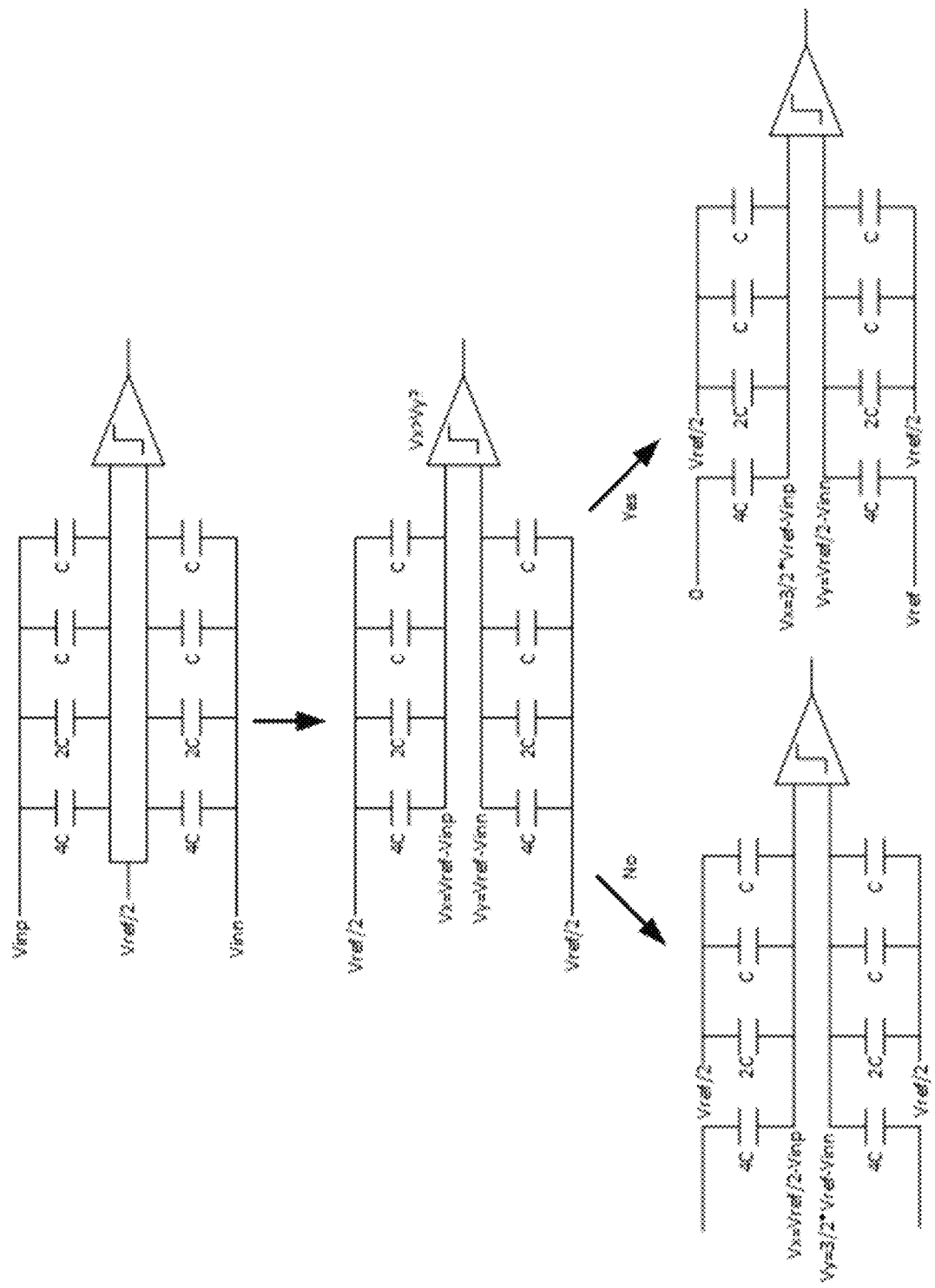
FIG. 7 illustrates schematic diagrams of a SAR ADC with vcm-based sampling showing the first two steps of successive approximation, according to the teachings of this disclosure.
Figure 8:
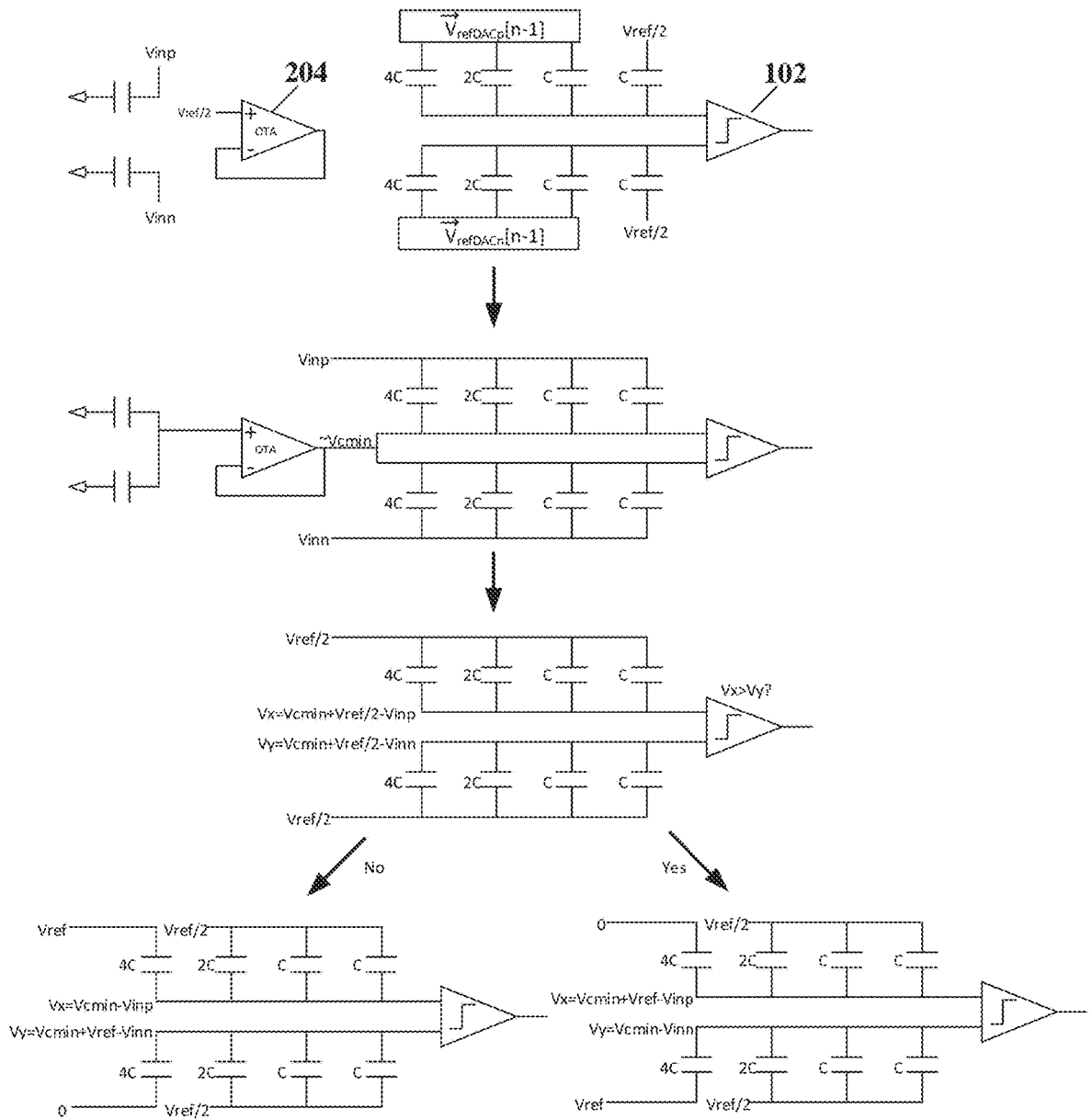
FIG. 8 illustrates schematic diagrams of a prior technology SAR ADC with vcm-based sampling showing the first two steps of successive approximation.
Figure 9:
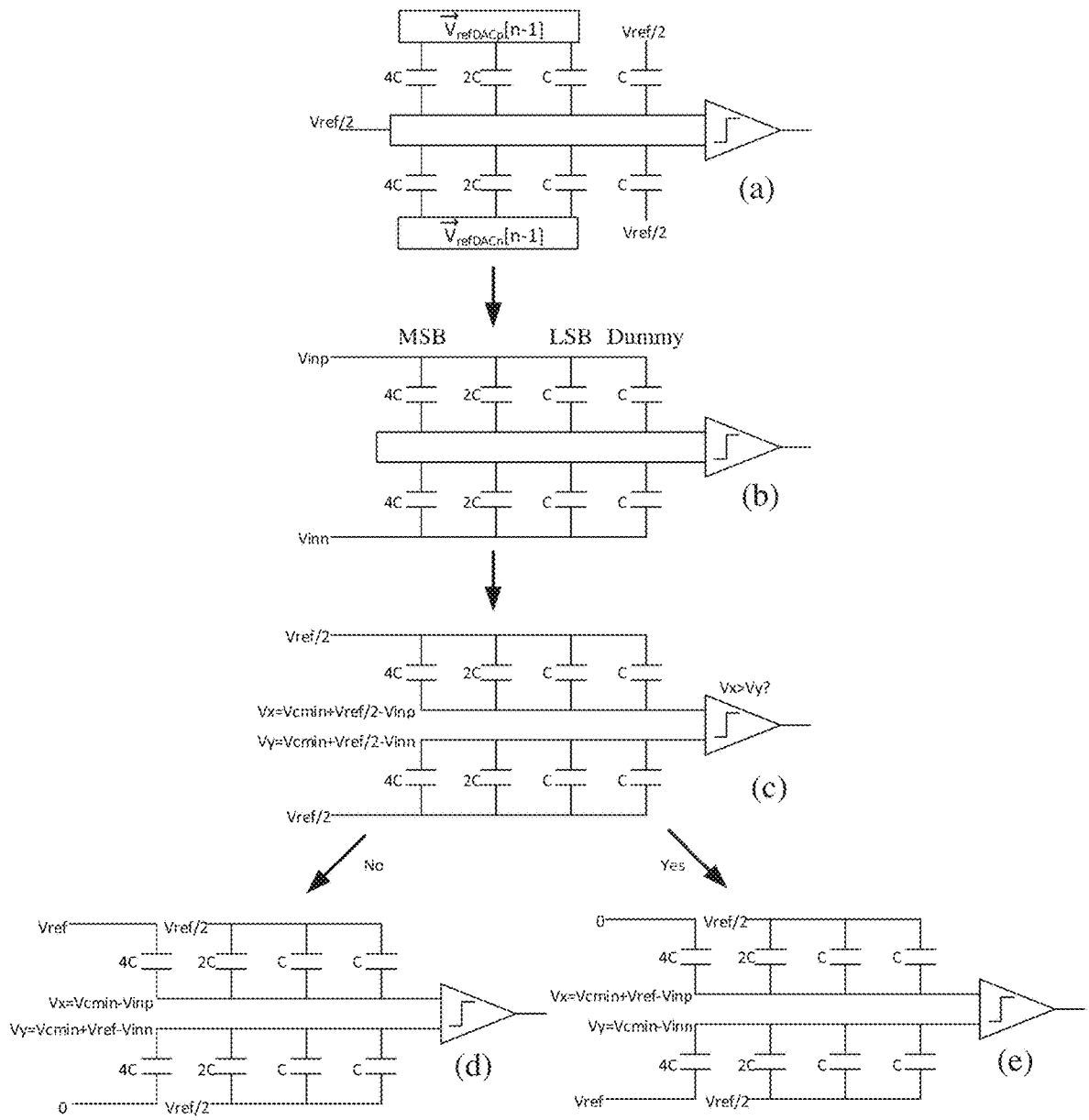
FIG. 9 illustrates schematic diagrams of a SAR ADC with vcm-based sampling showing the first two steps of successive approximation, according to specific example embodiments of this disclosure.

Many SAR ADCs use a capacitive DAC that provides an inherent track/hold function. Capacitive DACs employ the principle of charge redistribution to generate an analog output voltage. Because these types of DACs are prevalent in SAR ADCs, it is beneficial to discuss their operation. A capacitive DAC consists of an array of N capacitors with binary weighted values plus one "dummy LSB" capacitor. FIGS. 7-9 show examples of a 3-bit capacitive DAC connected to a comparator. The example uses a single positive vrefp and gnd as the differential references. This means that the reference common mode equals vrefp/2. During the acquisition phase, the array's common terminals (the terminals at which all the positive input and negative input capacitors share connections, respectively), is connected to Vref/2 and all free terminals are connected to the input signal (analog in +/− or Vinp/Vinn). After acquisition, the common terminal is disconnected from Vref/2 and the free terminals are disconnected from Vinp/Vinn, thus effectively trapping a charge proportional to the +/−input voltages on the capacitor array. The free terminals of all the capacitors are then connected to Vref/2, driving the common terminals to As the first step in the binary search algorithm, the bottom plate of the MSB capacitor is disconnected from ground and connected to $V_{REF}$. This drives the common terminal in the positive direction by an amount equal to $½V_{REF}$. Therefore, $V_{COMMON} = -V_{IN} + ½ \times V_{REF}$. The comparator output yields a logic 1 if $V_{COMMON} < 0$ (i.e., $V_{IN} > ½ \times V_{REF}$). The comparator output yields logic 0 if $V_{IN} < ½ \times V_{REF}$. If the comparator output is logic 1, then the bottom plate of the MSB capacitor stays connected to $V_{REF}$. Otherwise, the bottom plate of the MSB capacitor is connected back to ground. The bottom plate of the next smaller capacitor is then connected to $V_{REF}$ and the new $V_{COMMON}$ voltage is compared with ground. This continues until all the bits have been determined. In general, $V_{COMMON} = -V_{IN}\ B_{N-1} \times V_{REF}/2\ B_{N-2} \times V_{REF}/4\ B_{N-1} \times \ldots + B0 \times V_{REF}/2^{N-1}$ (B_ comparator output/ADC output bits).

Referring to FIG. 7, depicted are schematic diagrams of a SAR ADC with vcm-based sampling showing the first two steps of successive approximation, according to the teachings of this disclosure. Only the first two steps of successive approximation are shown in FIG. 7.

As discussed hereinabove, the comparator common-mode voltage is:

$$Vcmcomp = \frac{Vx + Vy}{2}$$
$$= \frac{Vref - Vinp + Vref - Vinn}{2}$$
$$= Vref - \frac{Vinp + Vinn}{2}$$
$$= Vref - Vcmin$$

If Vcmin=Vref/2, Vcmcomp is also Vref/2. But if Vcmin is close to 0 or Vref, Vcmcomp is far from Vref/2. This can lead to a performance reduction or even failure. Often a safe, restricted Vcmin range is specified. As discussed above, this can be solved by sampling inputs again instead of the fixed voltage Vref/2. The comparator common-mode voltage may be given as:

$$Vcmcomp = \frac{Vx + Vy}{2}$$
$$= \frac{Vcmin + Vref/2 - Vinp + Vcmin + Vref/2 - Vinn}{2}$$
$$= \frac{2 \cdot Vcmin}{2} + \frac{Vref}{2} - \frac{(Vinp + Vinn)}{2}$$
$$= \frac{Vref}{2}$$

The input common-mode is cancelled. The comparator is always at the same common-mode voltage and can set Vcmcomp to other fixed voltages than Vref/2 if desired.

Referring to FIG. 8, depicted are schematic diagrams of a prior technology SAR ADC with vcm-based sampling showing the first two steps of successive approximation. The circuit shown in FIG. 8 samples input common-mode voltage and buffers to the top-plates during sampling. However, this requires circuitry for averaging of the differential inputs, an additional buffer amplifier 204, and Vcmin must be sampled before the sampling inputs, so this SAR DAC solution cannot handle rapid changes in Vcmin.

Referring to FIG. 9, depicted are schematic diagrams of a SAR ADC with vcm-based sampling showing the first two steps of successive approximation, according to specific example embodiments of this disclosure. If nodes Vx and Vy are floating but shorted together during sampling, capacitive voltage division provides that Vx=Vy=Vcmin.

$$vx = vy = vinn + \frac{vinp - vinn}{2} = \frac{vinp + vinn}{2} = vcmin$$

In conversion step (a) the capacitor top plates are reset to Vref/2. In conversion step (b) a voltage sample is taken. In conversion step (c) a SAR bit conversion is performed. In conversion steps (d) and (e) the conversion bit is determined to be either a "1" or a "0". As discussed above, this solution may prevent Vx and Vy from drifting over time. Accordingly, an additional clock cycle may be added before each sample+convert step to reset Vx and Vy to some fixed voltage.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A method for providing wide input common-mode range in a successive approximation register (SAR) analog-to-digital convertor (ADC), said method comprising the steps of:

resetting top plate nodes vcp and vcn of a plurality of binary weighted capacitors to a voltage vcm;

sampling differential voltages Vinp and Vinn on bottom plate nodes vcp and vcn, respectively, while coupling the top plate nodes vcp and vcn together and floating; and performing a sequential SAR analog-to-digital conversion on the sampled differential voltages Vinp and Vinn.

2. The method according to claim 1, wherein the SAR ADC is a differential input SAR ADC.

3. The method according to claim 1, wherein the SAR ADC is fabricated in integrated circuit device.

4. The method according to claim 3, wherein the integrated circuit device is a microcontroller.

5. A method for providing wide input common-mode range in a successive approximation register (SAR) analog-to-digital convertor (ADC), said method comprising the steps of:

coupling top plates of a first half of a plurality of binary weighted capacitors to a first input of a voltage comparator and coupling top plates of a second half of the plurality of binary weighted capacitors to a second input of the voltage comparator;

coupling a top plate of a first dummy capacitor to the first input of the voltage comparator and coupling a top plate of a second dummy capacitor to the second input of the voltage comparator;

coupling a previous first reference voltage to bottom plates of the first half of the plurality of binary weighted capacitors;

coupling a previous second reference voltage to bottom plates of the second half of the plurality of binary weighted capacitors;

coupling a third reference voltage to the top plates of the plurality of binary weighted capacitors, and to the top and bottom plates of the first and second dummy capacitors;

decoupling the bottom plates of the plurality of binary weighted capacitors from the previous first and second reference voltages;

coupling the bottom plates of the first half of the plurality of binary weighted capacitors and the bottom plate of the first dummy capacitor to a positive input voltage, Vinp;

coupling the bottom plates of the second half of the plurality of binary weighted capacitors and the bottom plate of the second dummy capacitor to a negative input voltage, Vinn;

coupling the top plates of the plurality of binary weighted capacitors and the first and second dummy capacitors together;

decoupling the top plates of the first half of the plurality of binary weighted capacitors and the first dummy capacitor from the top plates of the second half of the plurality of binary weighted capacitors and the second dummy capacitor;

coupling the bottom plates of the plurality of binary weighted capacitors and the first and second dummy capacitors to the third reference voltage;

determining whether a first voltage on the first input of the voltage comparator is greater than a second voltage on the second input thereof;

wherein if the first voltage is greater than the second voltage then provide a first logic level output from the voltage comparator, and if the first voltage is less than the second voltage then provide a second logic level output from the voltage comparator; and continue doing a successive approximation analog-to-digital conversion until finished with the conversion.

6. The method according to claim 5, wherein the previous first reference voltage is from a first digital-to-analog converter (DAC), and the previous second reference voltage is from a second DAC.

7. The method according to claim 6, wherein the previous first and second reference voltages are Vref, and the third reference voltage is Vref/2.

8. The method according to claim 5, wherein the first logic level is a logic high or logic "1", and the second logic level is a logic low or logic "0".

9. The method according to claim 5, wherein the SAR ADC is a differential input SAR ADC.

10. The method according to claim 5, wherein the SAR ADC is fabricated in integrated circuit device.

11. The method according to claim 10, wherein the integrated circuit device is a microcontroller.

12. A successive approximation register (SAR) analog-to-digital converter (ADC), comprising circuitry configured to:

couple a third reference voltage to top plates of a plurality of binary weighted capacitors and top and bottom plates of first and second dummy capacitors;

couple a previous first reference voltage to bottom plates of a first half of the plurality of binary weighted capacitors;

couple a previous second reference voltage to bottom plates of a second half of the plurality of binary weighted capacitors;

decouple the bottom plates of the plurality of binary weighted capacitors and the first and second dummy capacitors from the respective first, second and third reference voltages;

couple together the bottom plates of the plurality of binary weighted capacitors and the first and second dummy capacitors;

couple a positive input voltage, Vinp, to the bottom plates of the first half of the plurality of binary weighted capacitors and the first dummy capacitor;

couple a negative input voltage, Vinn, to the bottom plates of the second half of the plurality of binary weighted capacitors and the second dummy capacitor;

decouple the bottom plates of the first half of the plurality of binary weighted capacitors and the first dummy capacitor from the bottom plates of the second half of the plurality of binary weighted capacitors and the second dummy capacitor;

compare a voltage Vx at the top plates of the first half of the plurality of binary weighted capacitors and the first dummy capacitor with a voltage Vy at the top plates of the second half of the plurality of binary weighted capacitors and the second dummy capacitor;

wherein if the voltage Vx is greater than the voltage Vy then
couple a fourth voltage to the bottom plate of a most significant bit (MSB) one of the first half of the plurality of binary weighted capacitors,
couple a fifth voltage to the bottom plate of a MSB one of the second half of the plurality of binary weighted capacitors, and
couple the third voltage to the bottom plates of the remaining plurality of binary weighted capacitors and the first and second dummy capacitors, or if the voltage Vx is less than the voltage Vy then
   couple the fifth voltage to the bottom plate of the MSB one of the first half of the plurality of binary weighted capacitors,
   couple the fourth voltage to the bottom plate of the MSB one of the second half of the plurality of binary weighted capacitors, and
   couple the third voltage to the bottom plates of the remaining plurality of binary weighted capacitors and the first and second dummy capacitors; and
continue doing a successive approximation analog-to-digital conversion until finished with the conversion.

13. The SAR ADC according to claim 12, wherein
the first previous reference voltage is from a first digital-to-analog converter;
the second previous reference voltage is from a second digital-to-analog converter;
the third reference voltage is Vref/2;
the fourth reference voltage is zero volts; and
the fifth reference voltage is Vref.

14. The SAR ADC according to claim 12, wherein the successive approximation register (SAR) analog-to-digital converter (ADC) is a differential input SAR ADC.

15. The SAR ADC according to claim 12, wherein the SAR ADC is fabricated in integrated circuit device.

16. The SAR ADC according to claim 15, wherein the integrated circuit device is a microcontroller.

* * * * *